US012563986B2

(12) United States Patent
Wu et al.

(10) Patent No.: US 12,563,986 B2
(45) Date of Patent: Feb. 24, 2026

(54) METHODS FOR FABRICATING SEMICONDUCTOR STRUCTURES HAVING TRANSISTOR ARRAYS WITH DIFFERENT PITCHES

(71) Applicant: Taiwan Semiconductor Manufacturing Company, Ltd., Hsinchu (TW)

(72) Inventors: Chia-Ling Wu, Tainan (TW); Ru-Shang Hsiao, Jhubei (TW); I-Shan Huang, Tainan (TW); Ying Hsin Lu, Tainan (TW); Tsung-Jui Wu, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 536 days.

(21) Appl. No.: 17/837,724

(22) Filed: Jun. 10, 2022

(65) Prior Publication Data

US 2023/0145694 A1      May 11, 2023

Related U.S. Application Data

(60) Provisional application No. 63/277,042, filed on Nov. 8, 2021.

(51) Int. Cl.
  *H01L 21/3065* (2006.01)
  *H01L 21/311* (2006.01)
(52) U.S. Cl.
  CPC .... *H01L 21/3065* (2013.01); *H01L 21/31138* (2013.01)

(58) Field of Classification Search
  CPC .......... H01L 21/3065; H01L 21/31138; H10D 64/117
  See application file for complete search history.

(56) References Cited

U.S. PATENT DOCUMENTS

| | | | | |
|---|---|---|---|---|
| 2012/0064686 A1* | 3/2012 | Farber | ............ | H01L 21/823814 438/711 |
| 2017/0221906 A1* | 8/2017 | Lin | ........................ | H10B 43/27 |
| 2017/0373189 A1* | 12/2017 | Lee | ...................... | H10D 62/832 |
| 2019/0165138 A1* | 5/2019 | Tsai | ...................... | H10D 30/024 |

OTHER PUBLICATIONS

Koehler, Fabian, et al., "Challenges in spacer process development for leading-edge high-k metal gate technology", Physica Status Solidi C, vol. 11(1), pp. 73-76 (Year: 2014).*

* cited by examiner

*Primary Examiner* — Fernando L Toledo
*Assistant Examiner* — Ryan T. Fortin
(74) *Attorney, Agent, or Firm* — Sterne, Kessler, Goldstein & Fox P.L.L.C.

(57)         ABSTRACT

The present disclosure describes a method for fabricating semiconductor structures having transistor arrays with different pitches. The method can include forming a first and second arrays of structures on a semiconductor substrate. The second array of structures can be blocked with a first mask while exposing the first array. A first treatment can be applied to the first array of structures. The first array of structures can be blocked with a second mask while exposing the second array of structures. A second treatment can be applied to the second array of structures, where the second treatment is different from the first treatment.

20 Claims, 12 Drawing Sheets

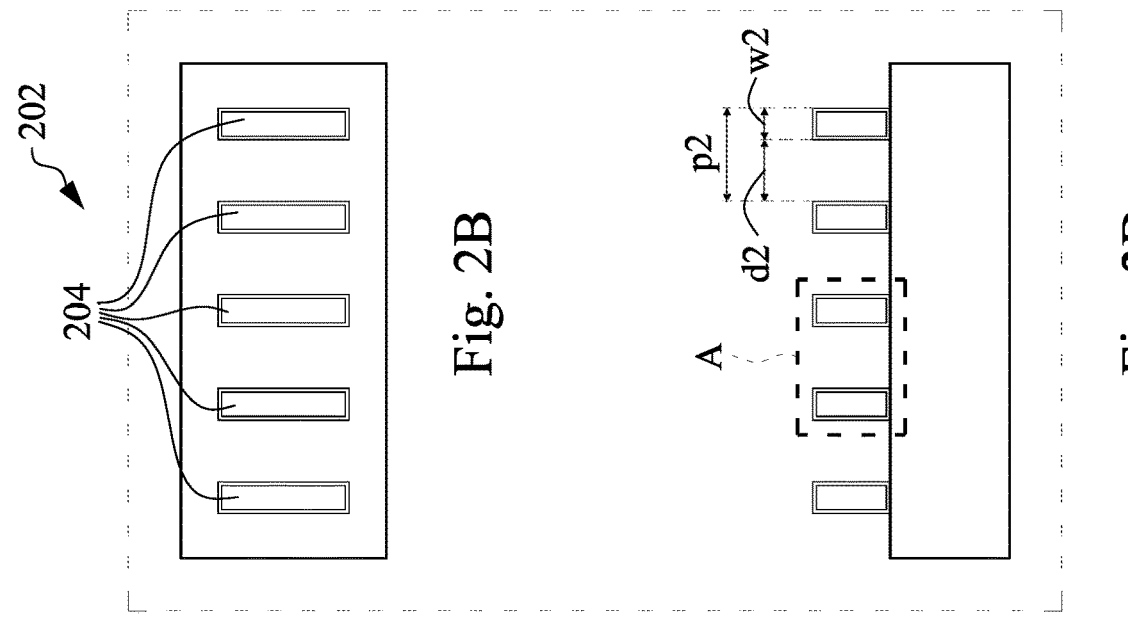
Fig. 2A
Fig. 2B
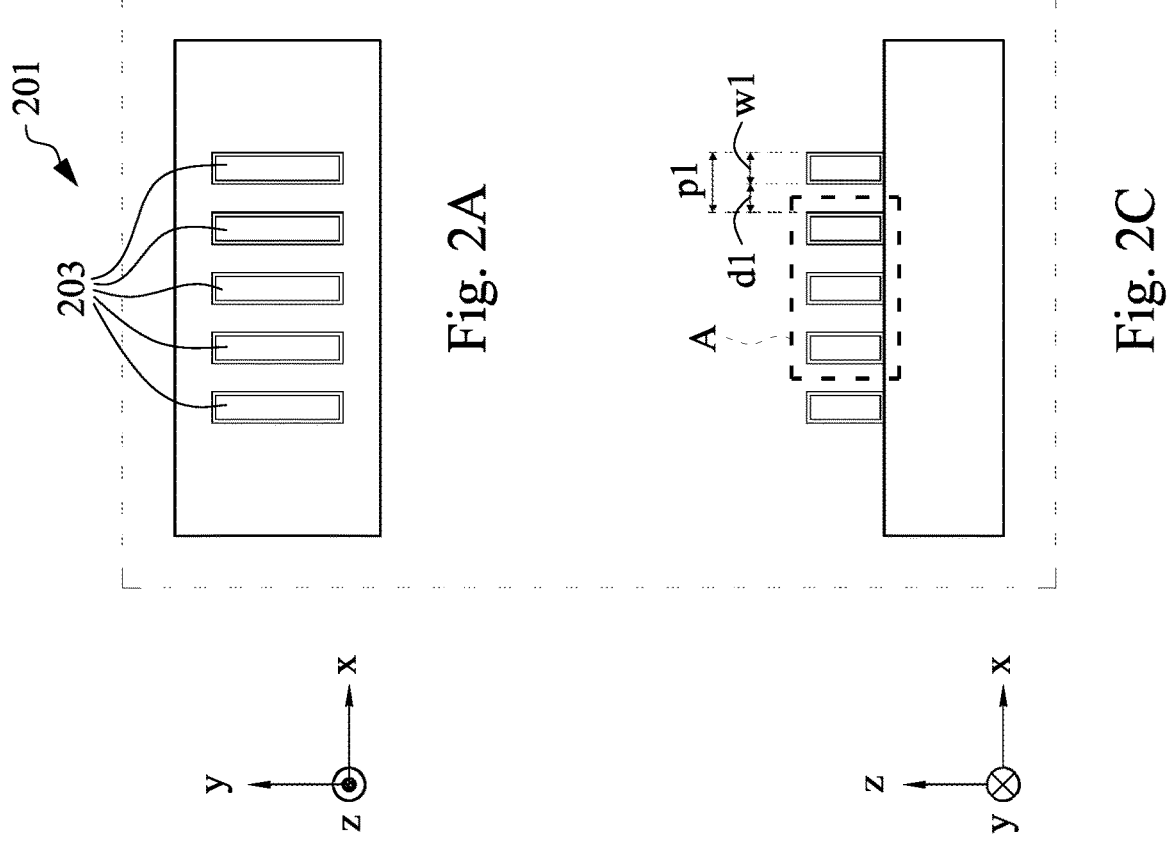
Fig. 2C
Fig. 2D

700

702 — Assess pattern density variations among devices and deposit a first mask to expose narrow pitch devices 704 — Etch silicon undercut using first mask 706 — Remove first mask 708 — Deposit a second mask to expose wide pitch devices 710 — Etch silicon undercut using second mask 712 — Remove second mask 714 — Fill undercut regions

METHODS FOR FABRICATING SEMICONDUCTOR STRUCTURES HAVING TRANSISTOR ARRAYS WITH DIFFERENT PITCHES

RELATED APPLICATION

This application claims benefit of U.S. Provisional Patent Application No. 63/277,042, filed on Nov. 8, 2021, titled "Process Loading Remediation," which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (FinFETs). Such scaling down has increased the complexity of semiconductor manufacturing processes.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

FIG. 2A is a top plan view of narrow pitch polysilicon structures, in accordance with some embodiments.

FIG. 2B is a top plan view of wide pitch polysilicon structures, in accordance with some embodiments.

FIG. 2C is a cross-sectional view of the narrow pitch polysilicon structures shown in FIG. 2A, in accordance with some embodiments.

FIG. 2D is a cross-sectional view of the wide pitch polysilicon structures shown in FIG. 2B, in accordance with some embodiments.

DETAILED DESCRIPTION

Figure 1:
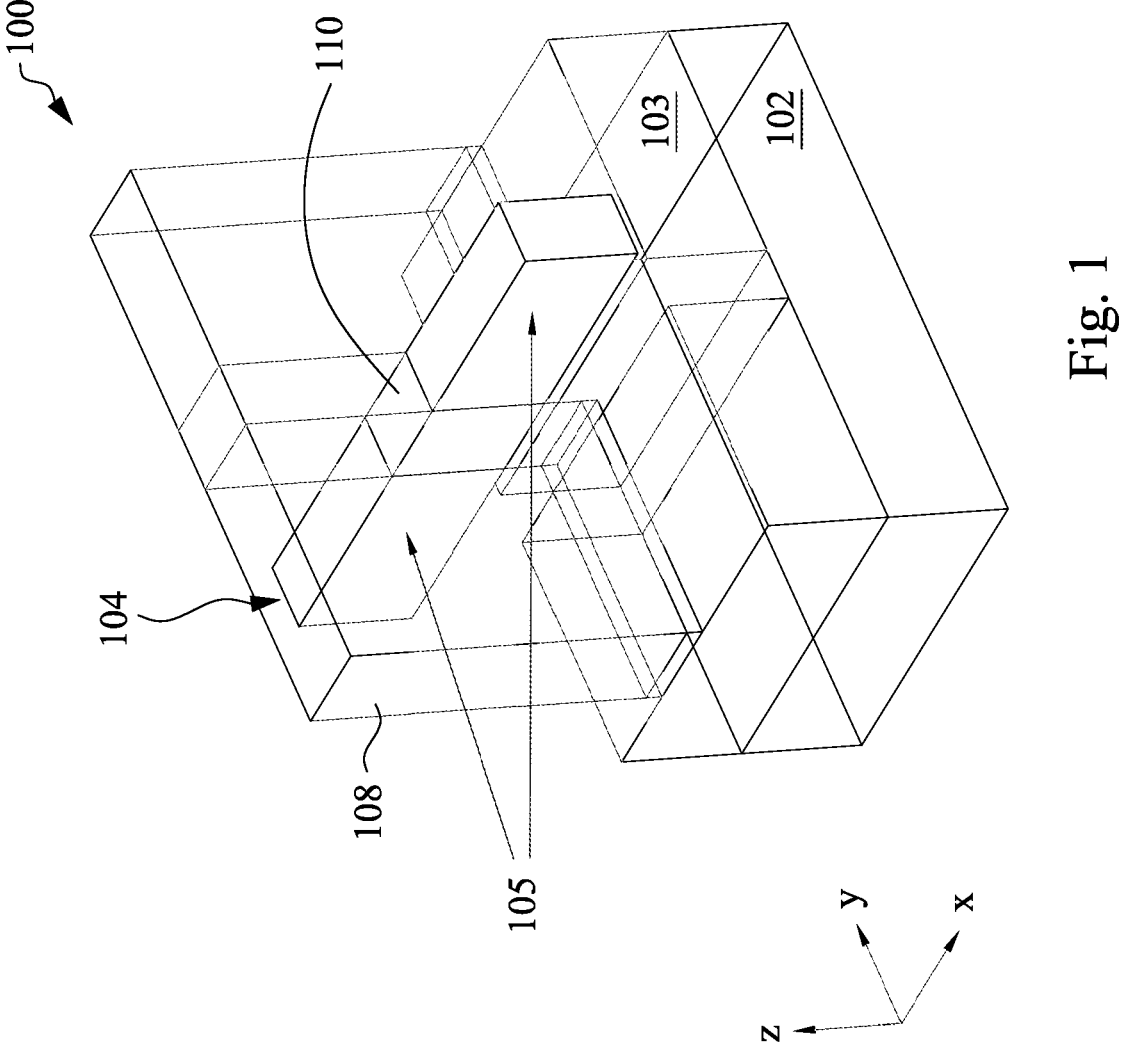
FIG. 1 is an isometric, transparent view of a FinFET, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed that are between the first and second features, such that the first and second features are not in direct contact.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of a target value (e.g., ±1%, ±2%, ±3%, ±4%, and ±5% of the target value).

The term "vertical," as used herein, means nominally perpendicular to the surface of a substrate.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

Some integrated circuit chips, such as systems-on-a-chip (SOCs), require different types of devices to be fabricated on the same chip. For example, a single chip may provide analog (e.g., radio frequency (RF)) devices for antennas and signal processing, as well as logic devices (microprocessors). Consequently, there may co-exist on the same chip devices having different pitches, linewidths, and pattern densities. Such differences in design and layout at various layers during manufacturing can influence aspects of the manufacturing process. For example, variations in the surface area of certain materials exposed to deposition or etch chemistries can "load" the surface chemical reactions differently by presenting different amounts of reactants. Such variation in the balance of chemical reactants can result in disparities in film thicknesses within the chip that can affect device performance.

FIG. 1 is an isometric view of a FinFET 100, with transparency, in accordance with some embodiments. FinFET 100 includes a substrate 102, isolation regions 103, a fin 104 having source and drain regions 105, respectively (each also referred to as "source/drain region 105"), a gate structure 108, and a channel 110. FinFET 100 is formed on substrate 102.

As used herein, the term "substrate" describes a material onto which subsequent material layers are added. The substrate itself may be patterned. Materials added on the substrate may be patterned or may remain unpatterned. Substrate 102 can be a bulk semiconductor wafer or the top semiconductor layer of a semiconductor-on-insulator (SOI) wafer (not shown), such as silicon-on-insulator. In some embodiments, substrate 102 can include a crystalline semiconductor layer with its top surface parallel to (100), (110), (111), or c-(0001) crystal plane. In some embodiments, substrate 102 can be made from an electrically non-conductive material, such as glass, sapphire, and plastic. Substrate 102 can be made of a semiconductor material such as silicon (Si). In some embodiments, substrate 102 can include (i) an elementary semiconductor, such as germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium carbide (SiGeC), silicon germanium (SiGe), gallium arsenic phosphide (GaAsP), gallium indium phosphide (InGaP), gallium indium arsenide (InGaAs), gallium indium arsenic phosphide (InGaAsP), aluminum indium arsenide (InAlAs), and/or aluminum gallium arsenide (AlGaAs); or (iv) a combination thereof. Further, substrate 102 can be doped with p-type dopants (e.g., boron (B), indium (In), aluminum (Al), or gallium (Ga)) or n-type dopants (e.g., phosphorus (P) or arsenic (As)). In some embodiments, different portions of substrate 102 can have opposite type dopants.

Shallow trench isolation (STI) regions 103 are formed in substrate 102 to electrically isolate neighboring FinFETs 100 from one another. STI regions 103 can be formed adjacent to fin 104. For example, an insulating material can be blanket deposited over and between each fin 104. The insulating material can be blanket deposited to fill the trenches (e.g., the space that will be occupied by STI regions 103 in subsequent fabrication steps) surrounding fins 104. A subsequent polishing process, such as a chemical mechanical polishing (CMP) process, can substantially planarize top surfaces of STI regions 103. In some embodiments, the insulating material for STI regions 103 can include, for example, silicon oxide, silicon nitride, silicon oxynitride, fluoride-doped silicate glass (FSG), or a low-k dielectric material. In some embodiments, the insulating material for STI regions 103 can be deposited using a flowable chemical vapor deposition (FCVD) process, a high-density-plasma (HDP) CVD process, using silane ($SiH_4$) and oxygen ($O_2$) as reacting precursors. In some embodiments, the insulating material for STI regions 103 can be formed using a sub-atmospheric CVD (SACVD) process or high aspect-ratio process (HARP), where process gases can include tetraethoxysilane (TEOS) and/or ozone ($O_3$). In some embodiments, the insulating material for STI regions 103 can be formed using a spin-on-dielectric (SOD), such as hydrogen silsesquioxane (HSQ) and methyl silsesquioxane (MSQ).

A fin including source/drain regions 105 is formed from a portion of substrate 102, extending outward from an upper surface of substrate 102 in the z-direction. Source/drain regions 105 are doped with either a positive or a negative species to provide charge reservoirs for FinFET 100. For example, for a negative FET (NFET), source/drain region 105 can include the substrate material, such as Si, and n-type dopants. For a positive FET (PFET), source/drain region 105 can include the substrate material, such as Si and SiGe, and p-type dopants. In some embodiments, the term "p-type" defines a structure, layer, and/or region as being doped with, for example, boron (B), indium (In), or gallium (Ga). In some embodiments, the term "n-type" defines a structure, layer, and/or region as being doped with, for example, phosphorus (P) or arsenic (As). An NFET device may be disposed in a p-type region of substrate 102, or PWELL. A PFET device may be disposed in an n-type region of substrate 102, or NWELL.

During operation of FinFET 100, current flows between source/drain regions 105, through channel 110, in response to a voltage applied to gate structure 108. Gate structure 108 surrounds three sides of the fin, so as to control the current flow through channel 110. Gate structure 108 can be a multi-layered structure that includes (not shown) a gate electrode, a gate dielectric that separates the gate electrode from the fin, and sidewall spacers. Gate structure 108 can be deposited, for example, by CVD, LPCVD, HDP CVD, PECVD, or any other suitable deposition process. Gate structure 108 can be patterned using a photolithography process that employs a photoresist mask, a hard mask, or combinations thereof. Gate structure 108 can be etched using a dry etching process (e.g., reaction ion etching) or a wet etching process. In some embodiments, the gas etchants used in the dry etching process can include chlorine, fluorine, bromine, or a combination thereof. In some embodiments, an ammonium hydroxide ($NH_4OH$), sodium hydroxide (NaOH), and/or KOH wet etch can be used to pattern gate structure 108, or a dry etch followed by a wet etch process can be used to pattern gate structure 108.

A single FinFET is shown in FIG. 1. However, gate structure 108 may wrap around multiple fins arranged along the y-axis to form multiple FinFETs. Likewise, separated regions of a single fin may be controlled by multiple gate structures 108, arranged along the x-axis, to form multiple FinFETs.

When a voltage applied to gate structure 108 exceeds a certain threshold voltage, FinFET 100 switches on and current flows through channel 110. When the applied voltage drops below the threshold voltage, FinFET 100 shuts off, and current ceases to flow through channel 110. Because the wrap-around arrangement of gate structure 108 influences channel 110 from three sides, improved control of the conduction properties of channel 110 is achieved in FinFET 100, compared with planar FETs.

A FinFET in which channel 110 takes the form of a multi-channel stack is known as a gate-all-around (GAA) FET. In a GAAFET, the multiple channels within the stack are surrounded on all four sides by the gate, so as to further improve control of current flow in the stacked channels.

In some embodiments, the gate electrode of gate structure 108 in a FinFET can be made of polysilicon. In some embodiments, the gate electrode of gate structure 108 can be made of metal, which can be fabricated by first forming a sacrificial polysilicon gate electrode, and later replacing the sacrificial polysilicon structure with a permanent metal gate. In both of these examples, polysilicon structures are instrumental in fabricating the gate of the FinFET.

FIGS. 2A-2D illustrate differences in pattern density of first and second arrays 201 and 202, respectively, of exemplary polysilicon structures, e.g., gate structures 108, in accordance with some embodiments. FIGS. 2A and 2B show top plan views of arrays 201 and 202, respectively. FIGS. 2C and 2D show corresponding cross-sectional views of arrays 201 and 202, respectively. Array 201 includes five polysilicon structures 203 associated with a first device, e.g., a logic device, or microprocessor; array 202 includes five polysilicon structures 204 associated with a second device, e.g., an RF device. Polysilicon structures 203 and 204 can each be part of respective FinFETs, similar to FinFET 100. Polysilicon structures 203 and 204 can have substantially equal widths w1 and w2, different pitches p1 and p2, and different separation distances d1 and d2 between adjacent polysilicon structures within arrays 201, 202. Widths w1 and w2 of polysilicon structures 203 and 204 correspond to gate lengths of gate structures 108. Transistor gate lengths determine switching speeds, a main performance metric for semiconductor devices. In some embodiments, widths w1 and w2 are in the range of about 16 nm to about 24 nm. In some embodiments, narrow pitch arrays 201 can have a pitch p1 in the range of about 80 nm to about 100 nm, and wide pitch arrays 202 can have a pitch p2 in the range of about 115 nm to about 145 nm. A ratio of p2/p1 is then in the range of about 1.2 to about 1.8.

Pattern density D is defined by D=width/pitch. In some embodiments, a width-to-pitch ratio of polysilicon structures 203 is in the range of about 35% to about 67%, and a width-to-pitch ratio of polysilicon structures 204 is in the range of about 14% to about 35%. Thus, the pattern density of polysilicon structures 203 is greater than the pattern density of polysilicon structures 204 because polysilicon structures 203 are closer together. There can be more narrow pitch polysilicon structures 203 within an area A than there are wide pitch polysilicon structures 204 in the same area A. Consequently, array 201 has a higher pattern density, while array 202 has a lower pattern density.

Figure 3:
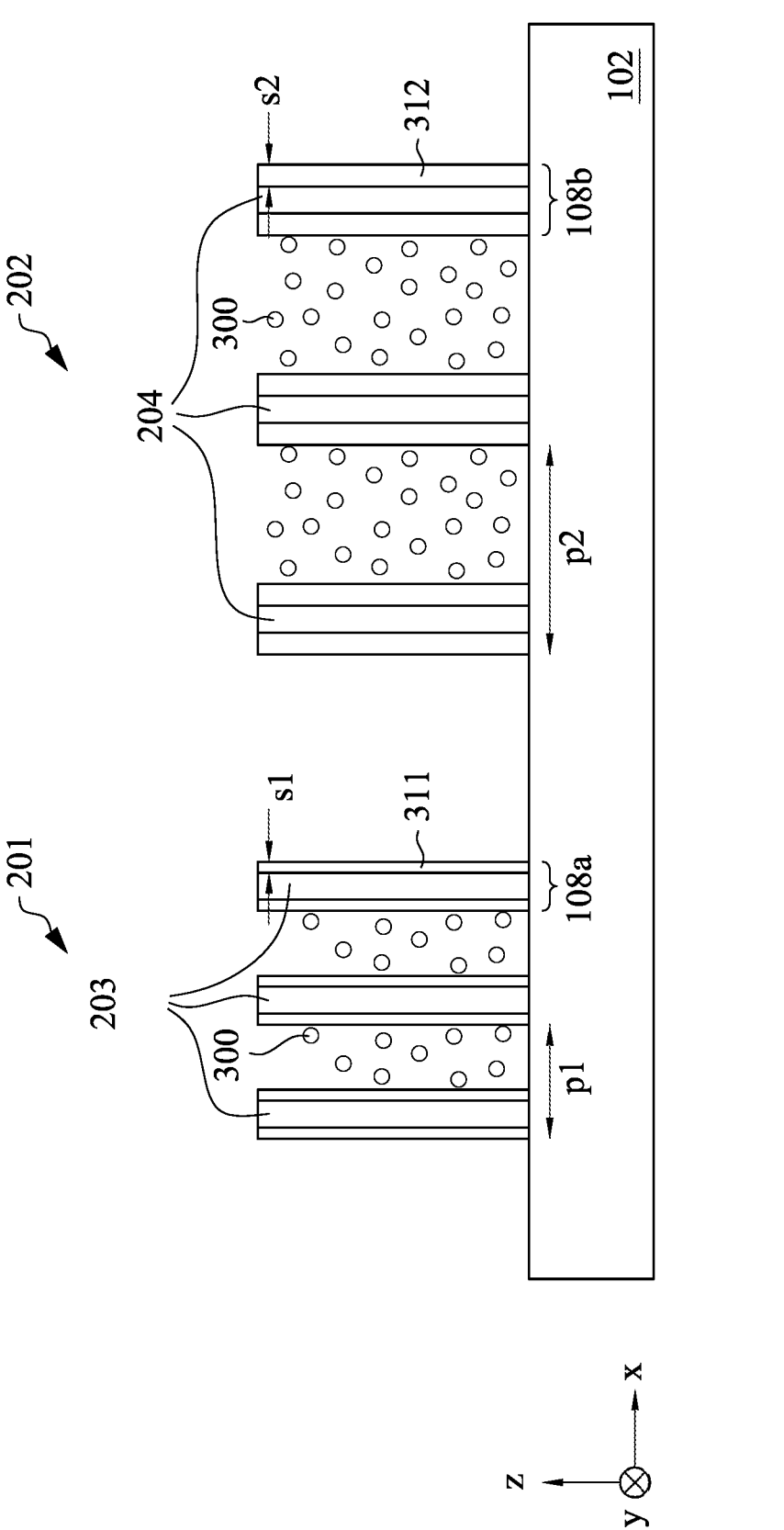
FIG. 3 is a cross-sectional view of sidewall profiles formed on the polysilicon lines shown in FIGS. 2C and 2D, in accordance with some embodiments.

FIG. 3 illustrates a consequence of exposing arrays 201 and 202 of polysilicon structures having different pattern densities to a process of sidewall spacer formation, in accordance with some embodiments. Sidewall spacers 311 and 312 are formed on polysilicon structures 203 and 204, respectively. Sidewall spacers 311 and 312 can be made of, for example, silicon nitride (SiN). In some embodiments, a silicon nitride deposition process provides precursors 300, e.g., gaseous nitrogen-containing precursors that fill spaces between polysilicon structures 203 of array 201 and between polysilicon structures 204 of array 202. Precursors 300 react with polysilicon at the surfaces of polysilicon structures 203 and 204, forming SiN sidewall spacers 311 and 312, respectively. Sidewall spacers 311 and 312 have thicknesses s1 and s2, respectively.

In some embodiments, sidewall spacers 311 and 312 can each include other insulating materials, such as silicon oxide, a low-k dielectric material, or a combination thereof. In some embodiments, each of sidewall spacers 311 and 312 can have respective thicknesses in a range from about 2 nm to about 10 nm along the x-direction. Based on the disclosure herein, other materials and thicknesses for sidewall spacers 311 and 312 are within the scope and spirit of this disclosure.

Because polysilicon structures 204 are spaced apart by a wider distance than polysilicon structures 203, more precursors 300 can enter the spaces between adjacent polysilicon structures 204. More precursors 300 between adjacent polysilicon structures 204 provide more chemical reactants to the deposition reaction at the surface of polysilicon structures 204, which increases the spacer deposition rate, causing sidewall spacers 312 to be deposited thicker than sidewall spacers 311, so that s2 may be greater than s1.

Pattern density variation can compromise performance of devices formed from wide pitch polysilicon structures 204. Thicker sidewall spacers can further compromise performance of devices formed from wide pitch polysilicon structures 204. In addition to creating thicker sidewall spacers, more nitrogen-containing precursors 300 may consume more polysilicon material from wide pitch polysilicon structures 204 than from narrow pitch polysilicon structures 203, causing gate structures 108b within array 202 to be narrower than gate structures 108a within array 201. Narrower gate structures 108b may cause current channels in the finished wide pitch devices of array 202 to be shorter and may partially offset the effect of thicker sidewall spacers 312. However, the total distance between source and drain, which affects device performance, depends on the entire gate structure 108, including sidewall spacers. When the size of the entire gate structure 108b exceeds that of 108a, the performance of array 202 may be compromised compared with the performance of array 201.

FIGS. 4A-4F illustrate a further consequence of exposing arrays 201 and 202, bearing sidewall spacers 311 and 312, respectively, to a subsequent undercut etch process, in accordance with some embodiments. The undercut etch process is intended to undercut gate structures 108a and 108b to effectively shorten the length of the current channel that will connect source/drain regions 105. The undercut etch process removes silicon adjacent to gate structures 108, to produce semi-circular profiles 401 and 402, which will later be filled with epitaxially-grown source and drain materials. If the device is a planar FET, semi-circular profiles 401 and 402 can be formed in substrate 102. If the device is a FinFET, semi-circular profiles 401 and 402 can be formed in fin 104 corresponding to source/drain regions 105. For simplicity, FIGS. 4A-4F show semi-circular profiles 401 and 402 being formed in substrate 102.

Figure 4C:
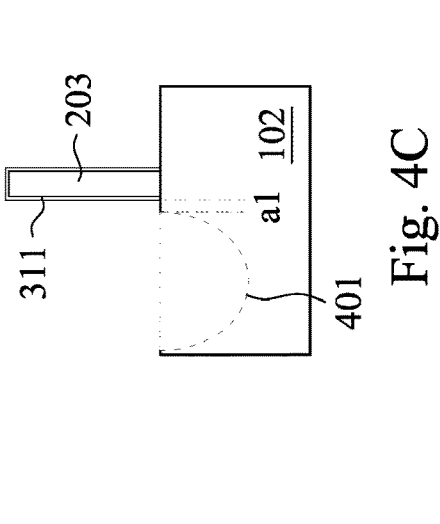
FIG. 4C is a magnified view of a polysilicon structure shown in FIG. 4B, in accordance with some embodiments.
Figure 4F:
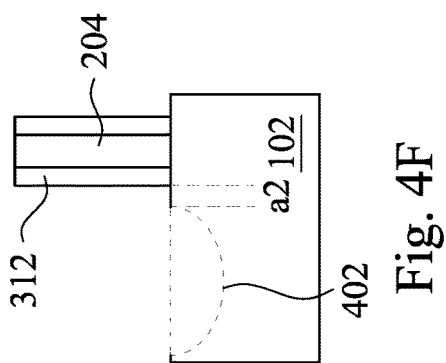
FIG. 4F is a magnified view of a polysilicon structure shown in FIG. 4E, in accordance with some embodiments.
Figure 4B:
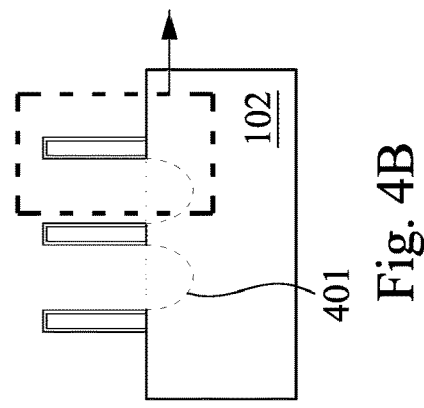
FIG. 4B is a cross-sectional view of narrow pitch polysilicon structures following an undercut etch process, in accordance with some embodiments.
Figure 4E:
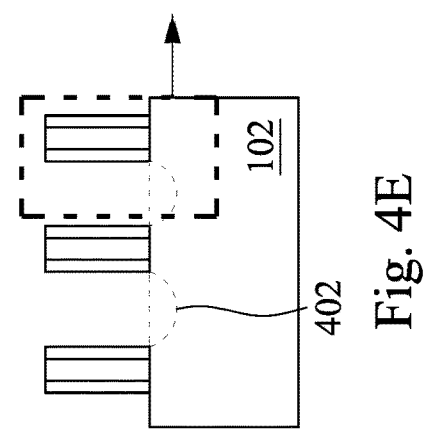
FIG. 4E is a cross-sectional view of wide pitch polysilicon structures following an undercut etch process, in accordance with some embodiments.
Figure 4A:
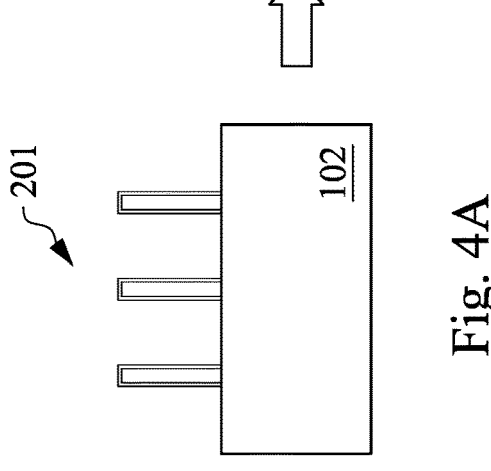
FIG. 4A is a cross-sectional view of narrow pitch polysilicon structures having thin sidewall spacers, as shown in FIG. 3, in accordance with some embodiments.
Figure 4D:
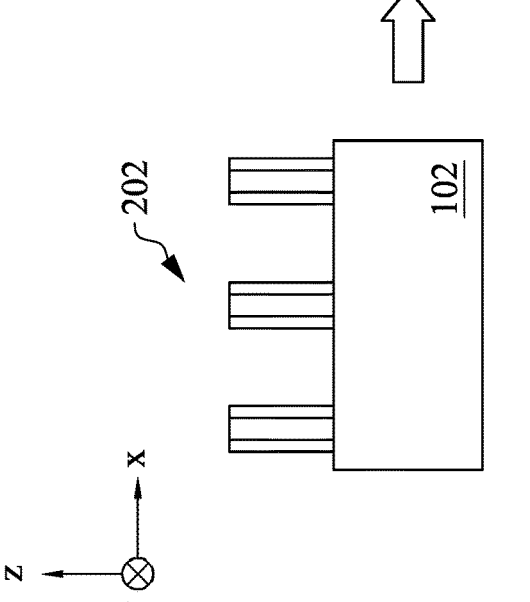
FIG. 4D is a cross-sectional view of wide pitch polysilicon structures having thick sidewall spacers, as shown in FIG. 3, in accordance with some embodiments.

FIGS. 4A and 4D reproduce arrays 201 and 202 following spacer formation, as shown in FIG. 3. When arrays 201 and 202 are subsequently exposed to an isotropic etch chemistry, semi-circular profiles 401 and 402, respectively, are formed in substrate 102 adjacent to polysilicon structures 203 and 204. For a given etch time, the consumption of silicon is substantially fixed. Therefore, sizes and shapes of semicircular profiles 401 and 402 can vary depending on the spacing between polysilicon structures 203 and 204, which determines the amount of substrate 102 that is exposed to the etchant. When a larger surface area of substrate 102 is exposed as in FIG. 4D, the resulting semi-circular profile 402 (FIGS. 4E, 4F) can be shallower than semi-circular profile 401, for which less surface area is exposed (FIGS. 4B, 4C).

Meanwhile, wider sidewall spacers 312 can also cause semi-circular profile 402 to be spaced farther apart from gate structure 108*b*, at a2, compared with a proximity a1 of semi-circular profile 401 with respect to gate structure 108*a*. This variation in proximity of the semi-circular profiles 401, 402 to the adjacent polysilicon structures 203, 204 is evident in the magnified views of dotted-line-box regions shown in FIGS. 4C and 4F, in which a2>a1. In some embodiments, semi-circular profile 402 may undercut sidewall spacer 312, but not polysilicon structure 204. In some embodiments, semi-circular profile 402 may not undercut gate structure 108*b* at all, effectively lengthening the channel even further, and thereby degrading performance of wide pitch arrays 202, relative to performance of narrow pitch arrays 201.

In some embodiments, to address the pitch dependent process loading problems described above, different treatments can be applied to the narrow pitch and wide pitch arrays. For example, regions having a low pattern density can be treated with a first etching process and regions having a high pattern density can be treated with a second etching process, different from the first etching process. Applying different treatments to different types of devices based on pattern density can be accomplished, for example, by adding a mask layer to the process so that narrow pitch devices can be masked while processing wide pitch devices, and vice versa. In some embodiments, the mask layer can be implemented as a photoresist mask. In some embodiments, the mask layer can be implemented as a hard mask, with or without a photoresist mask. By applying different treatments to narrow pitch and wide pitch arrays 201 and 202, proximities a1 and a2 can be independently adjusted.

In some embodiments, to address the pitch dependent process loading problems described above, process chemistries with reactants, e.g., gaseous nitrogen-containing precursors, can be used. In some embodiments, this can be accomplished by surrounding devices with dummy polysilicon structures covering a substantial surface area, and to use a quantity and placement of polysilicon dummy structures to tune the deposition rate of sidewall spacers 312.

Figure 5:
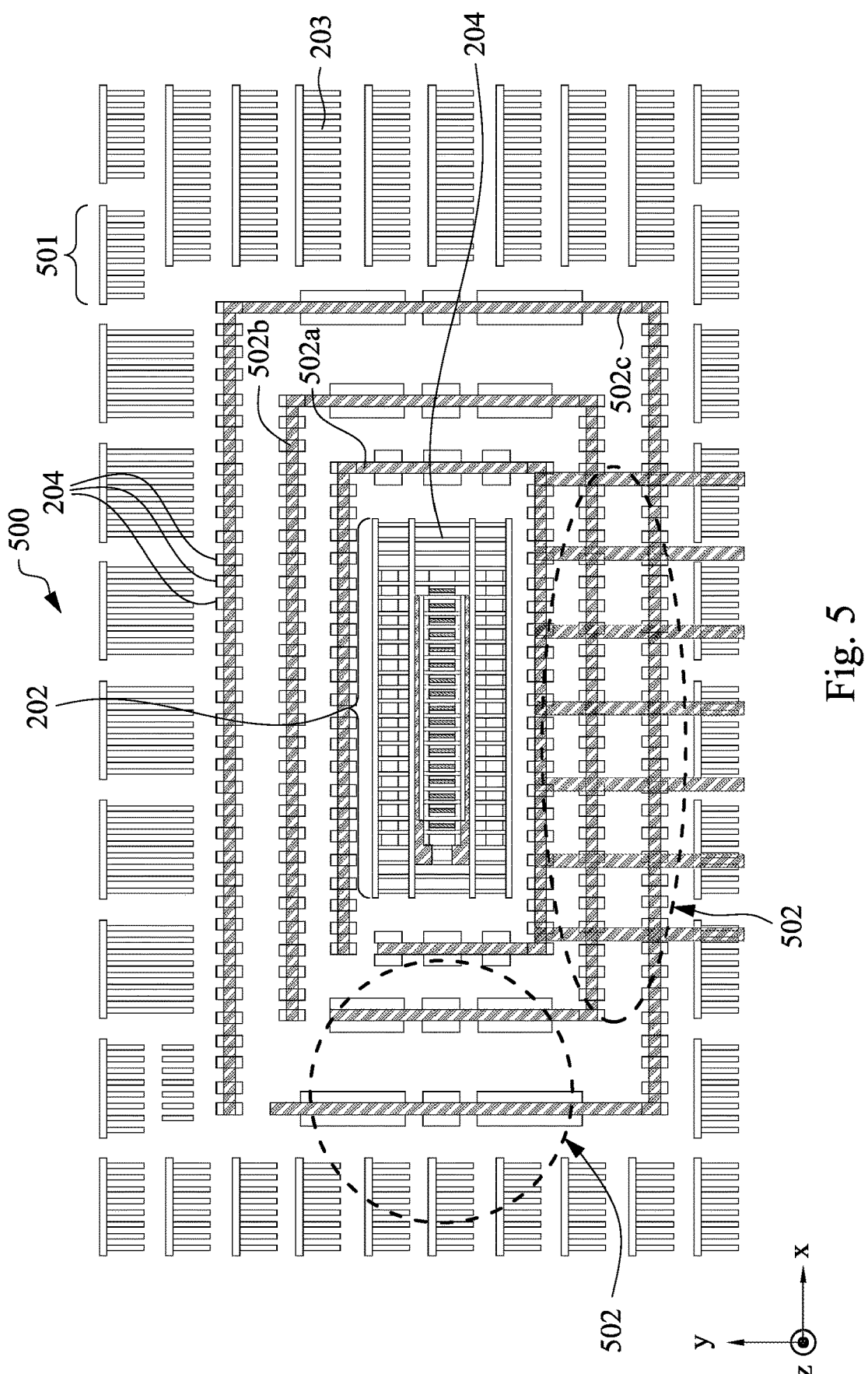
FIG. 5 is a top plan view of a mask for use in patterning an analog device, in accordance with some embodiments.

FIG. 5 illustrates an exemplary mask 500 for use in patterning analog (e.g., RF) devices, in accordance with some embodiments. At the center of mask 500, polysilicon structures 204 are arranged in wide pitch arrays 202. Analog (e.g., RF) devices can be identified, or located, by one or more metal ring patterns, known as guard rings 502, as shown within dotted line circles in FIG. 5. Guard rings 502 are placed around the circumference of wide pitch arrays 202 (three examples shown, 502*a*, 502*b*, and 502*c*). In some embodiments, guard rings 502 can be arranged as a series of concentric circumferential metal ring patterns, e.g. concentric rectangles, surrounding the central pattern of analog (e.g., RF) devices. In some embodiments, outer guard rings, e.g., 502*c*, are spaced farther apart than inner guard rings, e.g., 502*a*. In some embodiments, each successive metal ring pattern out from the central pattern is spaced apart from a preceding metal ring pattern by a greater distance. In some embodiments, the patterns of guard rings 502 are nearly closed except for a single gap so that guard rings 502 are discontinuous and therefore do not form closed shapes. In some embodiments, wide pitch arrays of polysilicon structures 204 are patterned across horizontal sides of guard rings 502, and fields of polysilicon structures are patterned to coincide with vertical sides of guard rings 502. Metal guard rings 502 are associated with analog (e.g., RF) devices, not logic devices, according to some embodiments. Therefore metal guard rings 502 can be used to identify array 202 as a wide pitch array of polysilicon structures 204 that are components of analog (e.g., RF) devices.

In some embodiments, mask 500 includes dummy structures around the circumference of guard rings 502. Dummy structures can be in the form of polysilicon combs 501 made up of polysilicon structures 203. Polysilicon combs 501 can be arranged to fill a surface area of a chip or a chip region. Polysilicon combs 501 can include different numbers of polysilicon structures 203 so that polysilicon combs 501 may vary in length. Some polysilicon combs 501 can have shorter teeth, while others have longer teeth. Sizes, and arrangements of polysilicon combs 501 can be adjusted to modify the pattern density of polysilicon material. Due to process loading, changes in pattern density can influence the thickness of sidewall spacers 312, and in turn, can influence proximity a2 of analog (e.g., RF) devices.

Figure 6:
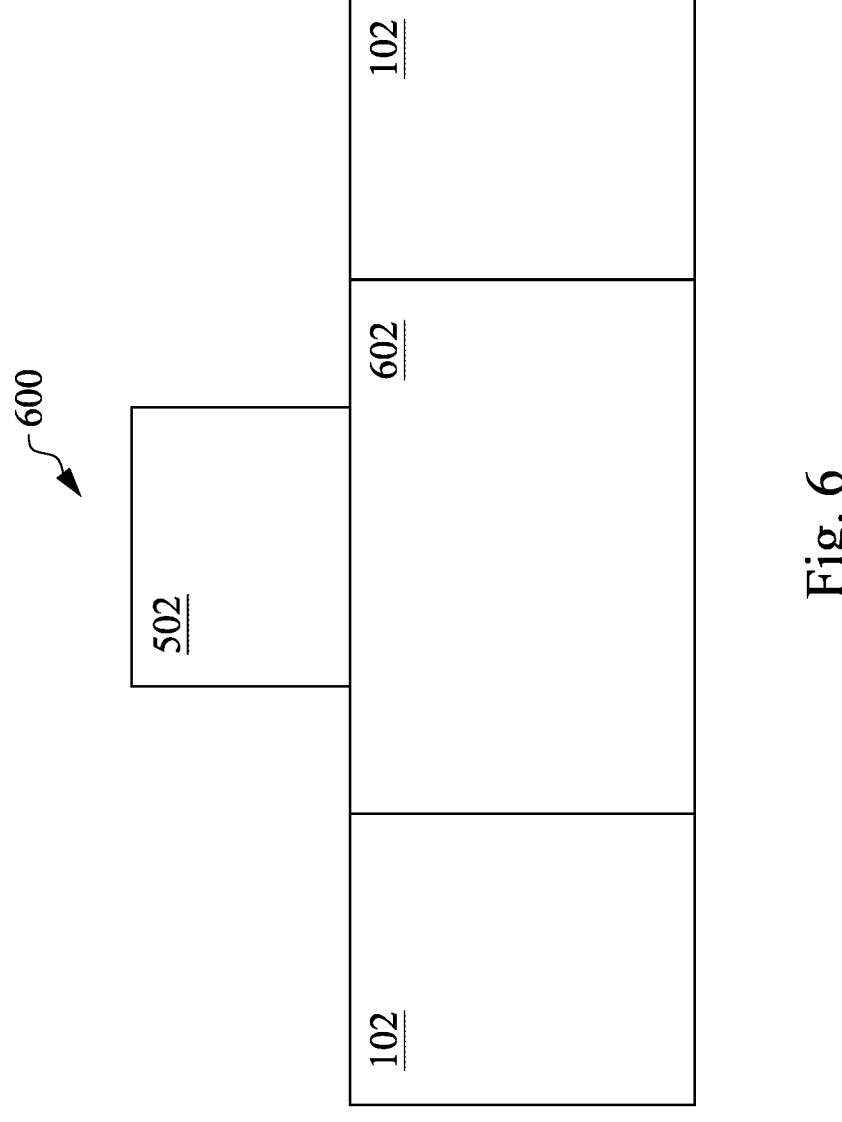
FIG. 6 is a cross-sectional view of a silicon implant region that serves as a landing structure, in accordance with some embodiments.

FIG. 6 illustrates a landing structure 600 underlying guard rings 502, in accordance with some embodiments. Landing structure 600 includes substrate 102 and, embedded in substrate 102, a silicon implant region 602. Guard rings 502 are represented as metal traces. Silicon implant region 602 is doped with either p-type impurities or n-type impurities, in one or more concentrations. Metal traces of guard rings 502 are patterned on top (e.g., directly on top) of silicon implant region 602, where a width of silicon implant region 602 exceeds a width of guard ring 502. In some embodiments, a polarity of dopants in silicon implant region 602 corresponding to each metal trace is opposite that of doped regions corresponding to adjacent metal traces. For example, when silicon implant region 602 below an innermost guard ring 502*a* is n-type, silicon implant region 602 below a middle guard ring 502*b* is p-type, and silicon implant region 602 below an outermost guard ring 502*c* is n-type. Or, when silicon implant region 602 below innermost guard ring 502*a* is p-type, silicon implant region 602 below middle guard ring 502*b* is n-type, and silicon implant region 602 below outermost guard ring 502*c* is p-type.

Figure 7:
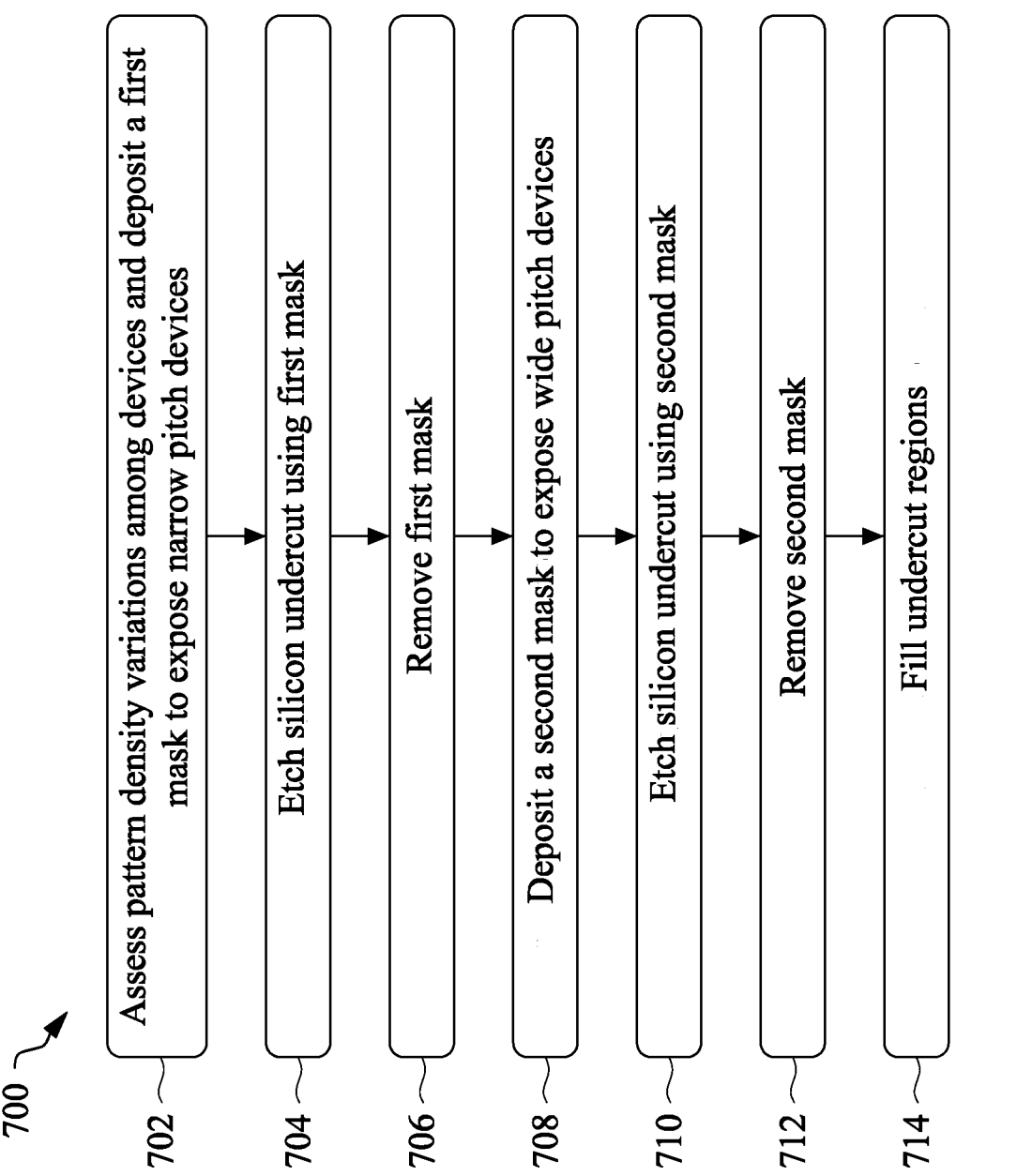
FIG. 7 is a flow diagram of a method of processing wide pitch and narrow pitch devices on a same chip, in accordance with some embodiments.

FIG. 7 is a flow diagram of a method 700 for forming semi-circular profiles 401 and 402 in substrate 102, as shown in FIGS. 4C and 4F, in accordance with some embodiments. For illustrative purposes, operations illustrated in FIG. 7 will be described with reference to cross-sectional views of polysilicon structures 203 and 204 and semi-circular profiles 401 and 402 at various stages of their fabrication, according to some embodiments. Operations can be performed in a different order, or not performed, depending on specific applications. For example, the first mask referenced in FIG. 7 can be associated with wide pitch devices and the second mask can be associated with narrow pitch devices, instead of the order shown in FIG. 7. It is noted that method 700 may not produce a complete semiconductor device. Accordingly, it is understood that additional processes can be provided before, during, or after method 700, and that some of these additional processes may only be briefly described herein.

Figure 8:
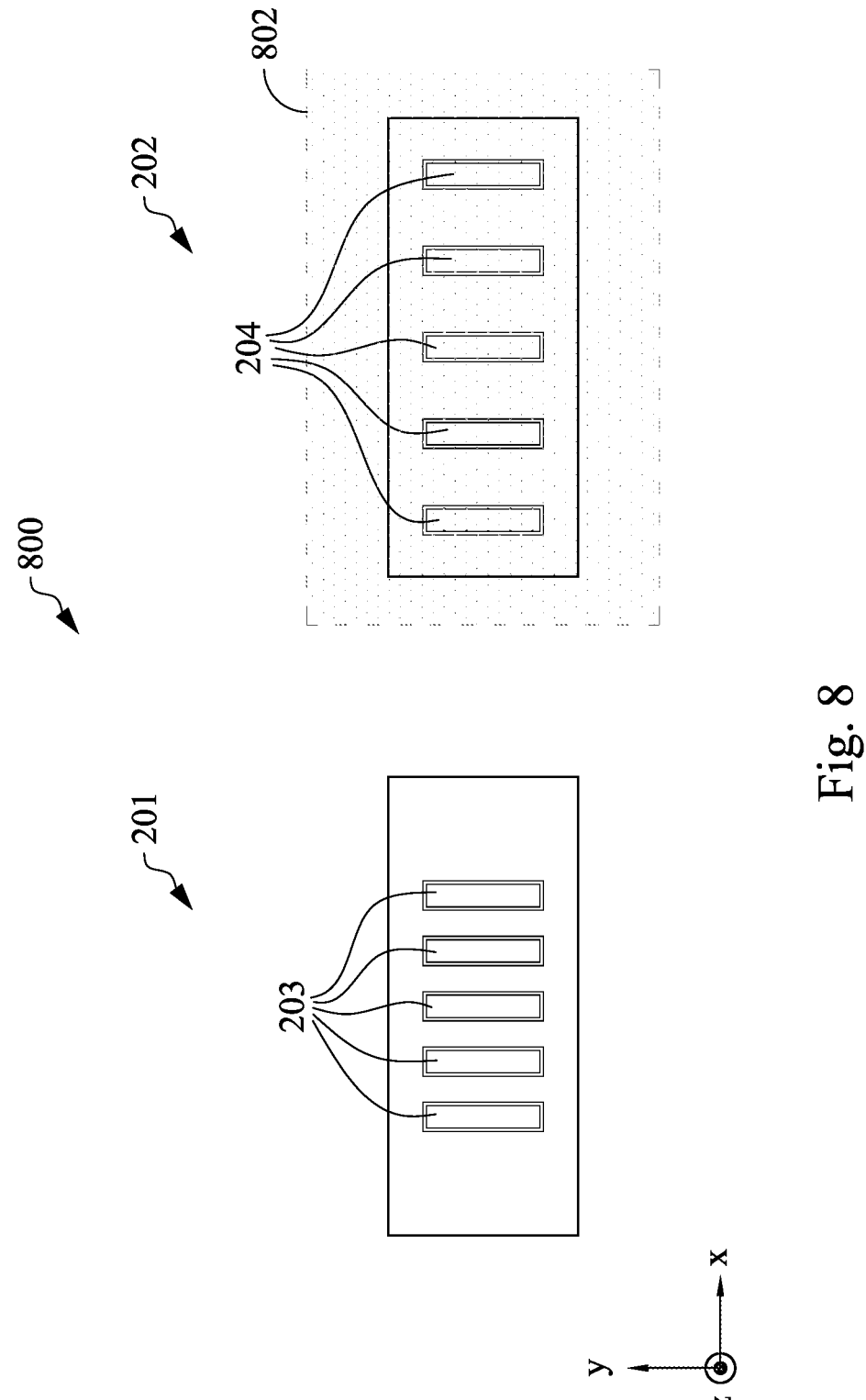
FIG. 8 is a top plan view of narrow and wide pitch polysilicon structures in proximity to one another, in which the narrow pitch polysilicon structures are masked, in accordance with some embodiments.

Referring to FIG. 7, in operation 702, pattern density variations among devices on a same chip are assessed and a first mask can be deposited to expose narrow pitch devices as shown in FIG. 8, in accordance with some embodiments.

Pattern density variations can be recognized by scanning a surface of the chip under a microscope and searching for a region 800 in which narrow pitch arrays 201 and wide pitch arrays 202 are arranged in proximity to one another. Scanning and search operations can be accomplished manually by a human operator, or they can be automated. Scanning and searching for pattern density variations can be done using one or more of various types of microscopes, e.g., an optical microscope, a scanning electron microscope (SEM), or other microscope that can be used to image a surface in a non-destructive manner. Wide pitch arrays 202 can be identified, for example, by pattern recognition of metal guard rings 502 that provide a large scale distinctive pattern indicating the presence of analog (e.g., RF) devices, as shown in FIG. 5. Specific locations of high and low pattern density devices can then be determined, to identify a particular chip layout. Wide and narrow pitch arrays may be considered to differ from one another when their pitch ratio of wide pitch/narrow pitch exceeds about 1.5, according to some embodiments.

In some embodiments, method 700 is applied to existing narrow pitch arrays 201 and wide pitch arrays 202 as described above. In some embodiments, operation 702 of method 700 can include forming narrow pitch arrays 201 and wide pitch arrays 202, as described above with respect to FIG. 1, FIGS. 2A-2D and FIG. 3. In some embodiments, arrays 201 and 202 can include only polysilicon structures 203 and 204. In some embodiments, arrays 201 and 202 can include polysilicon structures 203, 204 and sidewall spacers 311, 312.

The chip layout can be associated with a pair of masks that can be used to tailor the undercut etch process for narrow pitch and wide pitch devices. In some embodiments, a first mask 802 can be a photoresist mask that is spun onto a full wafer. Dies can then be illuminated in a lithography stepper, and the photoresist developed to expose narrow pitch devices, e.g., logic, and to block wide pitch devices, e.g., analog devices.

Figure 9B:
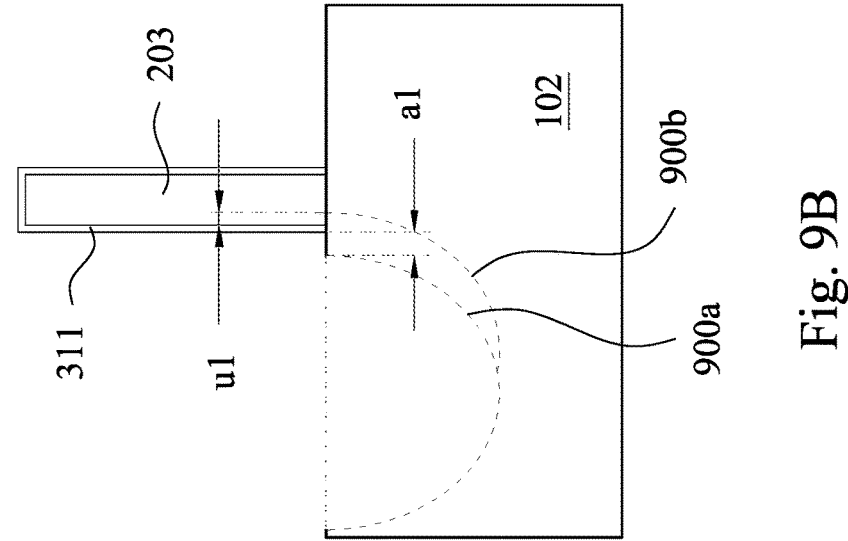
FIG. 9B is a magnified view of the narrow pitch array shown in FIG. 9A.
Figure 9A:
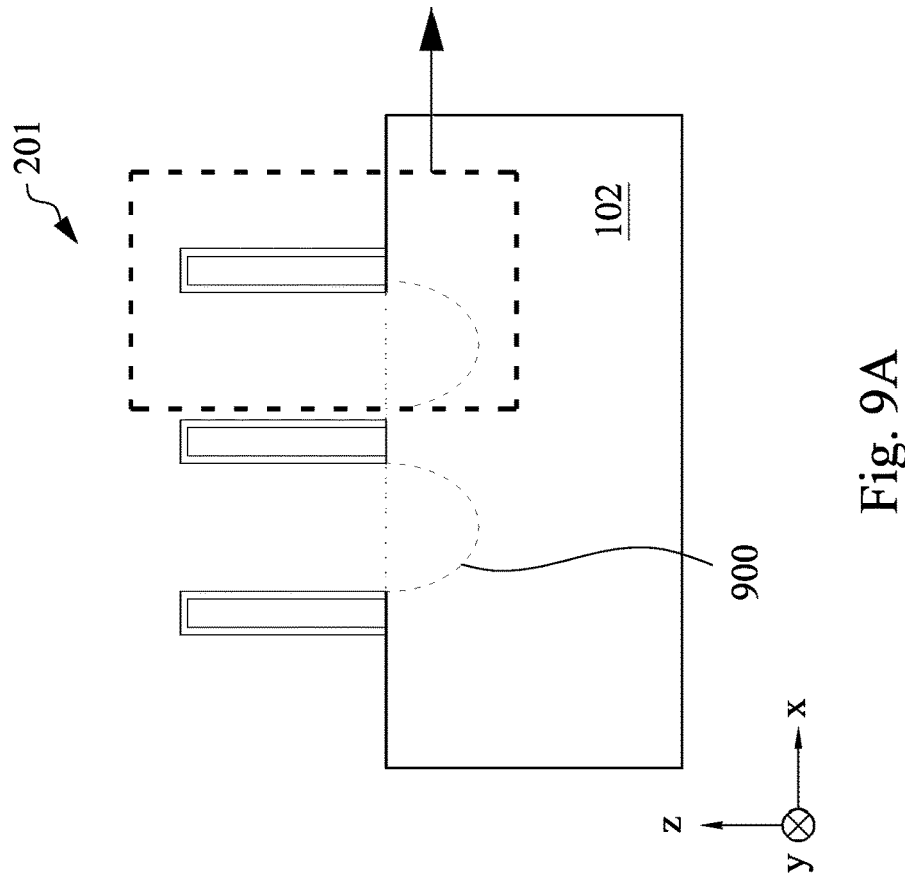
FIG. 9A is a cross-sectional view of a narrow pitch array following an undercut etch process, in accordance with some embodiments.

At operation 704, a silicon undercut etch process can be performed on exposed logic devices, with reference to FIGS. 9A and 9B, in accordance with some embodiments. Parameters of the undercut etch process can be optimized to tune, or eliminate proximity a1 for narrow pitch polysilicon structures 203. In some embodiments, semicircular profiles, e.g., 900a extend closer to polysilicon structures 203 so that proximity a1 is reduced. In some embodiments, semicircular profiles 900 extend to the edge of polysilicon structures 203 so that proximity a1 is substantially eliminated. In some embodiments, semicircular profiles, e.g., 900b undercut polysilicon structures 203 by an undercut distance u1.

The etching process for removing silicon isotropically to form semi-circular profiles 900 can be a dry etch process, a wet etch process, or a combination thereof. In some embodiments, the dry etch process can include using a plasma dry etch using a gas mixture that includes, for example, one or more of octafluorocyclobutane ($C_4F_8$), argon (Ar), oxygen ($O_2$), helium (He), fluoroform ($CHF_3$), carbon tetrafluoride ($CF_4$), difluoromethane ($CH_2F_2$), chlorine ($Cl_2$), hydrogen bromide (HBr), or a combination thereof at a pressure ranging from about 1 mTorr to about 500 mTorr. In some embodiments, a wet etch process can include using a diluted hydrofluoric acid (DHF) treatment, an ammonium peroxide mixture (APM), a sulfuric peroxide mixture (SPM), hot deionized water (DI water), tetramethylammonium hydroxide (TMAH), or a combination thereof. Based on the disclosure herein, other gas species or chemicals for the etching process are within the scope and spirit of this disclosure.

At operation 706, first mask 802 can be removed, in accordance with some embodiments. First mask 802 can be removed, for example, by ashing at a high temperature, e.g., in the range of about 200 to about 500 degrees C. The ashing process can then be followed by a wet cleaning process to remove remnants of the photoresist material.

Figure 10:
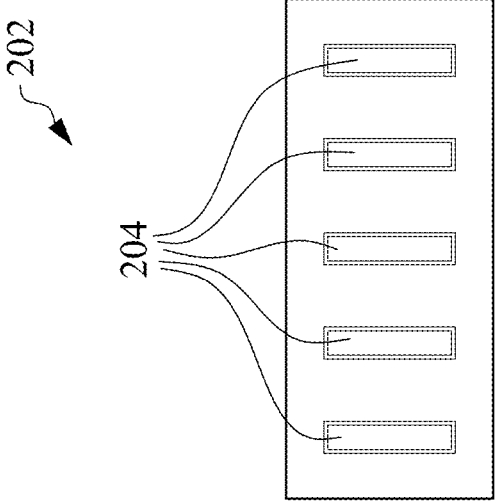
FIG. 10 is a top plan view of narrow and wide pitch polysilicon structures in proximity to one another, in which the wide pitch polysilicon structures are masked, in accordance with some embodiments.
Figure 10:
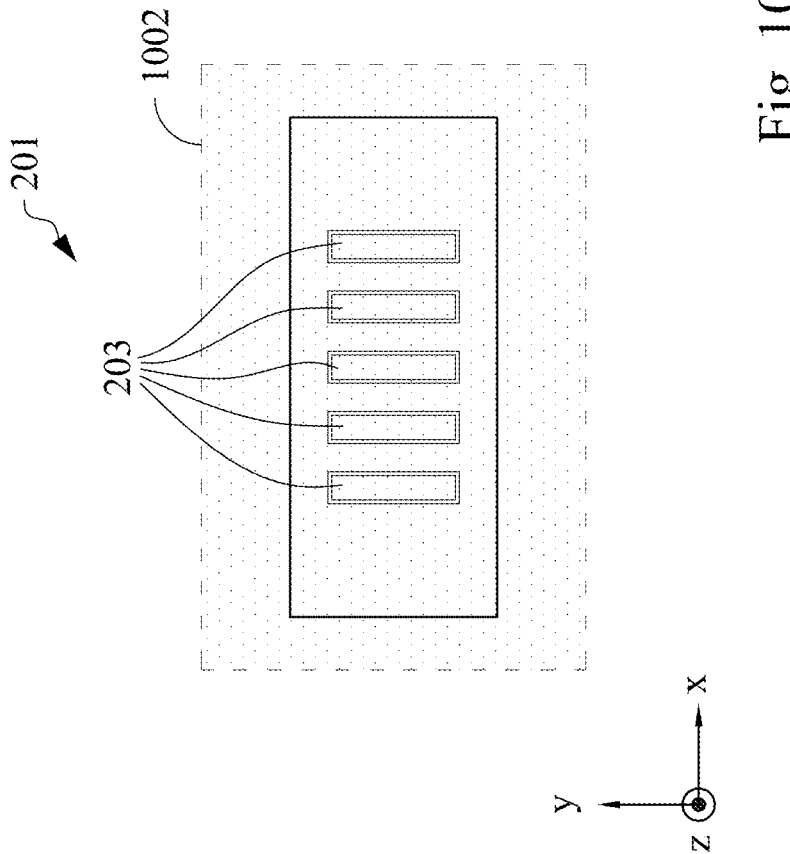

At operation 708, a second mask 1002 can be deposited, with reference to FIG. 10, in accordance with some embodiments. Second mask 1002 can be a photoresist mask that is spun onto a full wafer. Dies can then be illuminated in a lithography stepper, and the photoresist developed to expose wide pitch devices, e.g., analog devices, and to block narrow pitch devices, e.g., logic devices.

Figure 11B:
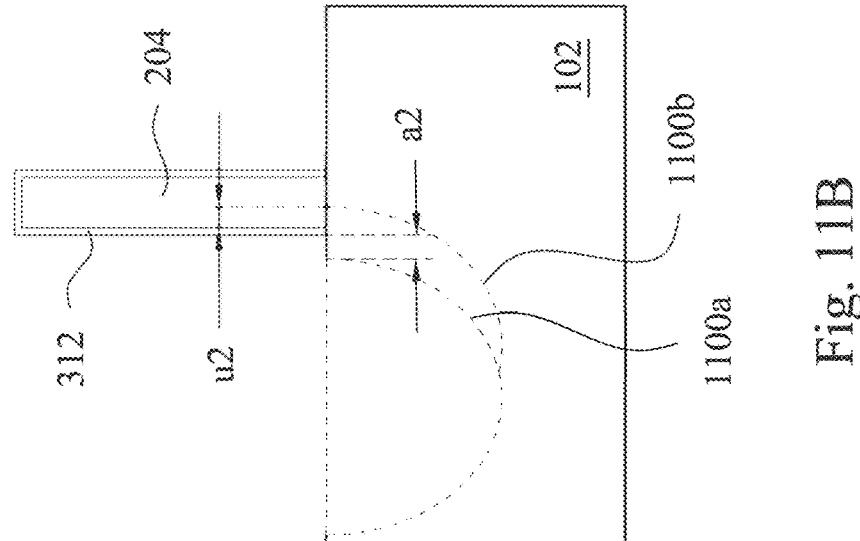
FIG. 11B is a magnified view of the wide pitch array shown in FIG. 11A.
Figure 11A:
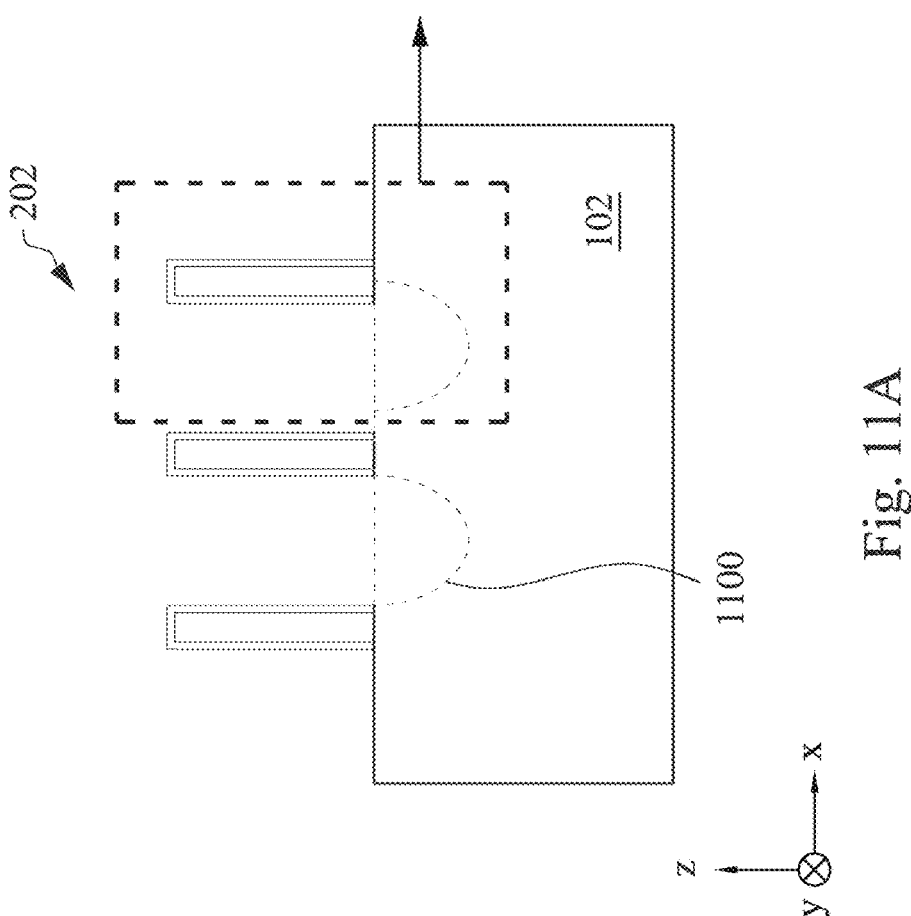
FIG. 11A is a cross-sectional view of a wide pitch array following an undercut etch process, in accordance with some embodiments.

At operation 710, a silicon undercut etch process can be performed on exposed analog (e.g., RF) devices, with reference to FIGS. 11A and 11B, in accordance with some embodiments. Parameters of the undercut etch process can be optimized to tune, or eliminate proximity a2 for wide pitch polysilicon structures 204. In some embodiments, semicircular profiles, e.g., 1100a extend closer to polysilicon structures 204 so that proximity a2 is reduced. In some embodiments, semicircular profiles 1100 extend to the edge of polysilicon structures 204 so that proximity a2 is substantially eliminated. In some embodiments, semicircular profiles, e.g., 1100b undercut polysilicon structures 204 by an undercut distance u2.

In some embodiments, it may be desirable to adjust a2 relative to a1 such that a proximity ratio a2/a1 is within a range of about 0.5 to about 2.0. For example, in some embodiments, proximity a1 for logic devices can be about 8 nm, while proximity a2 for analog (e.g., RF) devices can be modulated from 15 nm to 1 nm. This modulation of a2 can be brought about by changing etching parameters for analog (e.g., RF) devices without affecting the logic devices. Relevant etch parameters can be, for example, an extended etch time, a faster etch rate due to either increased applied power, increased gas flow, or a modified etch chemistry.

The etching process for removing silicon isotropically to form semi-circular profiles 1100 can be a dry etch process, a wet etch process, or a combination thereof. In some embodiments, the dry etch process can include using a plasma dry etch using a gas mixture that includes, for example, one or more of octafluorocyclobutane ($C_4F_8$), argon (Ar), oxygen ($O_2$), helium (He), fluoroform ($CHF_3$), carbon tetrafluoride ($CF_4$), difluoromethane ($CH_2F_2$), chlorine ($Cl_2$), hydrogen bromide (HBr), or a combination thereof at a pressure ranging from about 1 mTorr to about 500 mTorr. In some embodiments, a wet etch process can include using a diluted hydrofluoric acid (DHF) treatment, an ammonium peroxide mixture (APM), a sulfuric peroxide mixture (SPM), hot deionized water (DI water), tetramethylammonium hydroxide (TMAH), or a combination thereof. Based on the disclosure herein, other gas species or chemicals for the etching process are within the scope and spirit of this disclosure.

At operation 712, second mask 1002 can be removed, in accordance with some embodiments. Second mask 1002 can be removed, for example, by ashing at a high temperature, e.g., in the range of about 200 to about 500 degrees C. The ashing process can then be followed by a wet cleaning process to remove remnants of the photoresist material.

Figures 12A, 12B:
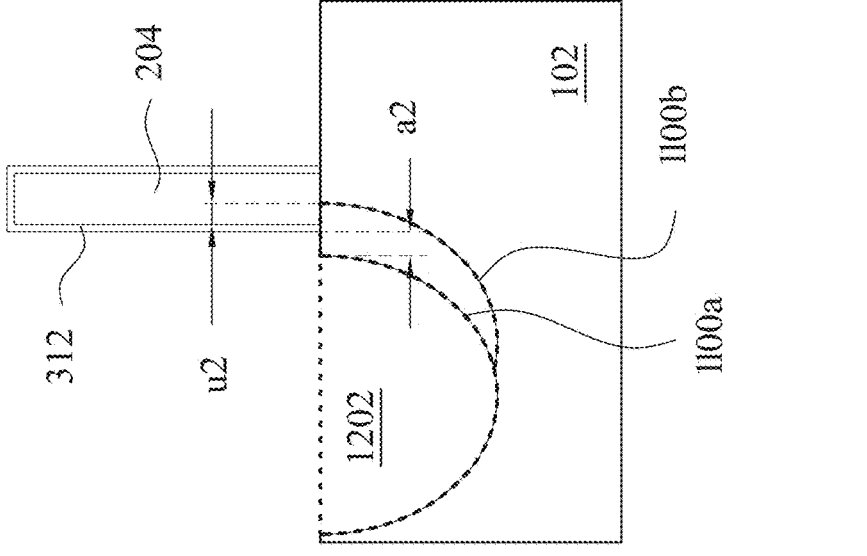
FIG. 12A is a magnified cross-sectional view of a narrow pitch array following an epitaxial growth process, in accordance with some embodiments.
FIG. 12B is a magnified cross-sectional view of a wide pitch array following an epitaxial growth process, in accordance with some embodiments.

At operation 714, semi-circular profiles 900 and 1100 can be filled with an epitaxial material 1202, as shown in FIGS. 12A and 12B, such as silicon, silicon germanium, or another material suitable for source/drain regions 105. Epitaxial source/drain regions 105 can be doped in-situ or ex-situ with boron, phosphorous, arsenic, or other suitable dopants to create NFET or PFET devices, in accordance with a prescribed circuit design.

In some embodiments, epitaxial material 1202 can be grown by (i) chemical vapor deposition (CVD), such as low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, source/drain regions 105 containing epitaxial material 1202 can be in-situ doped during the epitaxial growth using p-type or n-type dopants. In some embodiments, p-type doping precursors, such as diborane, boron trifluoride (BF$_3$), and/or other p-type doping precursors can be used to provide the p-type dopants during the epitaxial growth. In some embodiments, n-type doping precursors, such as phosphine (PH$_3$), arsine (AsH$_3$), and/or other n-type doping precursors can be used to provide the n-type dopants during the epitaxial growth. In some embodiments, source/drain regions 105 containing epitaxial material 1202 can be ex-situ doped using an ion implantation process.

In some embodiments, a method includes: forming a first set of polysilicon structures on a semiconductor substrate, the first set of polysilicon structures having a first pitch; forming a second set of polysilicon structures on the semiconductor substrate, the second set of polysilicon structures having a second pitch greater than the first pitch; depositing a first mask to block the second set of polysilicon structures; etching the semiconductor substrate using a first etch process; removing the first mask; depositing a second mask to block the first set of polysilicon structures; and etching the semiconductor substrate using a second etch process.

In some embodiments, a method includes: forming first and second arrays of structures on a semiconductor substrate; blocking the second array of structures with a first mask while exposing the first array; applying a first treatment to the first array of structures; blocking the first array of structures with a second mask while exposing the second array of structures; and applying a second treatment to the second array of structures, where the second treatment is different from the first treatment.

In some embodiments, a structure includes a substrate; a first array of polysilicon structures on the substrate, the first array being associated with logic devices and having a first pitch; first spacers of a first width formed on sidewalls of polysilicon structures in the first array; a second array of polysilicon structures on the substrate, the second array being associated with analog devices and having a second pitch; and second spacers of a second width formed on sidewalls of polysilicon structures in the second array.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a first set of polysilicon structures on a semiconductor substrate, the first set of polysilicon structures having first sidewall spacers and a first pitch;
forming a second set of polysilicon structures on the semiconductor substrate, the second set of polysilicon structures having second sidewall spacers and a second pitch greater than the first pitch;
depositing a first mask to block the second set of polysilicon structures;
etching the semiconductor substrate using a first etch process, wherein the first etch process comprises removing a first portion of the semiconductor substrate to form a first recess comprising a first edge adjacent to a polysilicon structure in the first set of polysilicon structures, wherein the first edge of the first recess is spaced apart from an adjacent sidewall spacer of the first sidewall spacers at a first distance greater than zero;
removing the first mask;
depositing a second mask to block the first set of polysilicon structures; and
etching the semiconductor substrate using a second etch process, wherein the second etch process comprises removing a second portion of the semiconductor substrate to form a second recess comprising a second edge adjacent to a polysilicon structure in the second set of polysilicon structures, and wherein the second edge of the second recess is spaced apart from an adjacent sidewall spacer of the second sidewall spacers at a second distance greater than the first distance.

2. The method of claim 1, wherein forming the sidewall spacers on the first and second sets of polysilicon structures comprises forming thicker sidewall spacers on the second set of polysilicon structures than on the first set of polysilicon structures.

3. The method of claim 1, wherein the first and second recesses form semi-circular profiles between adjacent polysilicon structures of the first set of polysilicon structures and between adjacent polysilicon structures of the second set of polysilicon structures.

4. The method of claim 1, further comprising replacing the removed first and second portions of the semiconductor substrate with an epitaxially-grown material.

5. The method of claim 1, wherein forming the first set of polysilicon structures comprises forming logic devices, and wherein forming the second set of polysilicon structures comprises forming radio frequency devices.

6. The method of claim 1, wherein forming the first and second sets of polysilicon structures comprises forming gate structures of planar field effect transistors.

7. The method of claim 1, wherein forming the first and second sets of polysilicon structures comprises forming gate structures of fin field effect transistors.

8. A method, comprising:
forming first and second arrays of structures on a semiconductor substrate, wherein the first and second arrays of structures comprise first sidewall spacers and second sidewall spacers, respectively;
blocking the second array of structures with a first mask while exposing the first array;
applying a first treatment to the first array of structures, wherein the first treatment comprises etching a first portion of the semiconductor substrate to form a first groove comprising a first edge adjacent to a structure in the first array of structures and spaced apart from an adjacent sidewall spacer of the first sidewall spacers a first distance greater than zero;

blocking the first array of structures with a second mask while exposing the second array of structures; and applying a second treatment to the second array of structures, wherein the second treatment is different from the first treatment, wherein the second treatment comprises etching a second portion of the semiconductor substrate to form a second groove comprising a second edge adjacent to a structure in the second array of structures and is spaced apart from an adjacent sidewall spacer of the second sidewall spacers at a second distance greater than the first distance.

9. The method of claim 1, wherein forming the first and second sets of polysilicon structures comprises forming gate structures of gate-all-around field effect transistors.

10. The method of claim 8, wherein the first and second treatments comprise the etching to remove the first and second portions of the semiconductor substrate.

11. The method of claim 8, wherein the first array of structures comprise logic devices and the second array of structures comprise analog devices.

12. The method of claim 11, wherein applying the first and second treatments is based on a difference in pattern density of the first and second arrays of structures.

13. The method of claim 8, further comprising after applying the first and second treatments, applying a third treatment to the first and second arrays of structures.

14. The method of claim 13, wherein applying the third treatment comprises filling removed portions of the semiconductor substrate with an epitaxial material.

15. A method, comprising:

forming a first set of polysilicon structures on a semiconductor substrate, the first set of polysilicon structures having first sidewall spacers and a first pitch;

forming a second set of polysilicon structures on the semiconductor substrate, the second set of polysilicon structures having second sidewall spacers and a second pitch different than the first pitch;

depositing a first mask to block the second set of polysilicon structures;

etching the semiconductor substrate, comprising removing a first portion of the semiconductor substrate to form a first recess comprising a first edge adjacent to a polysilicon structure in the first set of polysilicon structures, wherein the first edge of the first recess is spaced apart from an adjacent sidewall spacer of the first sidewall spacers at a first distance greater than zero;

depositing a second mask to block the first set of polysilicon structures; and etching the semiconductor substrate, comprising removing a second portion of the semiconductor substrate to form a second recess comprising a second edge adjacent to a polysilicon structure in the second set of polysilicon structures, wherein the second edge of the second recess is spaced apart from an adjacent sidewall spacer of the second sidewall spacers at a second distance greater than the first distance.

16. The method of claim 15, wherein forming the sidewall spacers on the first and second sets of polysilicon structures comprises forming thicker sidewall spacers on the second set of polysilicon structures than on the first set of polysilicon structures.

17. The method of claim 15, wherein forming the first set of polysilicon structures comprises forming logic devices, and wherein forming the second set of polysilicon structures comprises forming radio frequency devices.

18. The method of claim 15, wherein forming the first and second sets of polysilicon structures comprises forming gate structures of planar field effect transistors.

19. The method of claim 15, wherein forming the first and second sets of polysilicon structures comprises forming gate structures of fin field effect transistors.

20. The method of claim 15, wherein a ratio of the second distance to the first distance is within a range of 1.0 to about 2.0, exclusive of 1.0.

* * * * *